(12) United States Patent
Cowan

(10) Patent No.: US 6,864,563 B1
(45) Date of Patent: Mar. 8, 2005

(54) GROUNDING MECHANISM FOR SEMICONDUCTOR DEVICES

(75) Inventor: Joseph W. Cowan, West Linn, OR (US)

(73) Assignee: LSI Logic Corporation, Milpitas, CA (US)

( * ) Notice: Subject to any disclaimer, the term of this patent is extended or adjusted under 35 U.S.C. 154(b) by 331 days.

(21) Appl. No.: 10/158,641

(22) Filed: May 30, 2002

(51) Int. Cl.[7] .................................... H01L 23/552
(52) U.S. Cl. ................ 257/660; 257/659; 438/689; 438/712; 156/345.51
(58) Field of Search ................ 257/659, 660; 438/729, 689, 712, E21.218; 118/728; 156/345.51

(56) References Cited

U.S. PATENT DOCUMENTS

| | | | |
|---|---|---|---|
| 5,246,526 A | * | 9/1993 | Yamaguchi et al. ... 156/345.25 |
| 5,815,366 A | * | 9/1998 | Morita et al. ............... 361/234 |
| 6,174,370 B1 | * | 1/2001 | Yoshida ....................... 118/500 |
| 6,292,003 B1 | * | 9/2001 | Fredrickson et al. ......... 324/754 |
| 6,309,972 B1 | * | 10/2001 | Pio ............................. 438/689 |
| 6,793,767 B2 | * | 9/2004 | Chu et al. .............. 156/345.43 |
| 2003/0024643 A1 | * | 2/2003 | Abatchev et al. ......... 156/345.1 |
| 2003/0218463 A1 | * | 11/2003 | Stierman et al. ............ 324/534 |

* cited by examiner

*Primary Examiner*—Amir Zarabian
*Assistant Examiner*—Thanh Y. Tran
(74) *Attorney, Agent, or Firm*—Maginor, Moore and Beck

(57) ABSTRACT

A configuration including a grounding mechanism protects a semiconductor device from electrical overstress damage during processes, such as an RIE process, where an electrical charge can build up on the semiconductor device. According to an exemplary embodiment, the configuration secures a semiconductor device such that a die of the device is exposed to an electrically charged environment and electrically conductive terminals of the device are isolated from the electrically charged environment. The grounding mechanism electrically connects each of the electrically conductive terminals to a ground potential while the die is exposed to the electrically charged environment.

20 Claims, 9 Drawing Sheets

GROUNDING MECHANISM FOR SEMICONDUCTOR DEVICES

BACKGROUND OF THE INVENTION

1. Field of the Invention

The present invention generally relates to semiconductor devices, and more particularly, to a mechanism for protecting a semiconductor device from electrical overstress damage by electrically grounding the device during processes where an electrical charge can build up on the device.

2. Background Information

Semiconductor devices such as integrated circuit ("IC") devices have become key components of many consumer and commercial electronic products, often replacing discrete components and enhancing functionality. The semiconductor processing technologies that produce these devices have advanced to the point where complete systems, including memories, can be reduced to a single IC device.

Producing an IC device includes a number of individual processes. These processes include an assembly process where a wafer of semiconductor material is cut into a plurality of individual wafer dies. Each die is then assembled into a package by applying to each die an exterior coating typically comprised of an epoxy or ceramic material. A packaged die is often referred to as a packaged semiconductor device, or "chip."

Once packaged, an individual die may be placed through a variety of functional tests, either in the lab or in the field. Such tests may reveal that the packaged die is operating properly, or alternatively, may reveal that the packaged die is defective. In either case, it is often useful to determine why an individual packaged die operates in a particular manner.

Reactive ion etching ("RIE"), for example, is one commonly used technique to examine the internal structure of an individual die, and thereby determine why the die operates in a particular manner. In general, RIE involves using an electrically charged plasma to activate reactive ions which anisotropically (directionally) etch the die with varying degrees of selectivity. Accordingly, by using RIE, horizontal and/or vertical layers of a die may be selectively removed and the internal structure of the die may be examined. RIE is often used for delayering a die since it results in precise and repeatable etch rates, has good selectivity and can produce anisotropic etches which do not undercut metal layers on the die. Devices for performing RIE are commercially-available from companies, such as Nextral.

When performing an RIE process, a packaged die is typically placed within a shuttle device that exposes a portion of the packaged die to an RIE chamber where the reactive ions are present. Moreover, the shuttle device electrically insulates other portions of the packaged die from the RIE chamber to prevent their exposure to the reactive ions. For example, the shuttle device may insulate electrically conductive terminals (e.g., pins, solder balls, etc.) of the packaged die from the RIE chamber.

Despite the insulating function of the shuttle device, an electrical charge may accumulate on the packaged die during the RIE process. This electrical charge may cause electrical overstress damage to the packaged die, and thus destroy its ability to function in an intended manner.

Accordingly, there is a need for a mechanism that protects a packaged die from such electrical overstress damage during processes, such as an RIE process, where an electrical charge can build up on the device. The present invention addresses these and other issues.

SUMMARY OF THE INVENTION

In accordance with the present invention, an apparatus for exposing a semiconductor device to an electrically charged environment is provided. The apparatus comprises a configuration operative to secure the semiconductor device such that a first portion of the semiconductor device is exposed to the electrically charged environment and a second portion of the semiconductor device is isolated from the electrically charged environment. The configuration includes a grounding mechanism operative to electrically connect the second portion of the semiconductor device to a ground potential while the first portion of the semiconductor device is exposed to the electrically charged environment. The inclusion of the grounding mechanism protects the semiconductor device from electrical overstress damage because it does not allow damagingly high electrical charges to build up on the device.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

DESCRIPTION OF THE PREFERRED EMBODIMENTS

Figure 1:
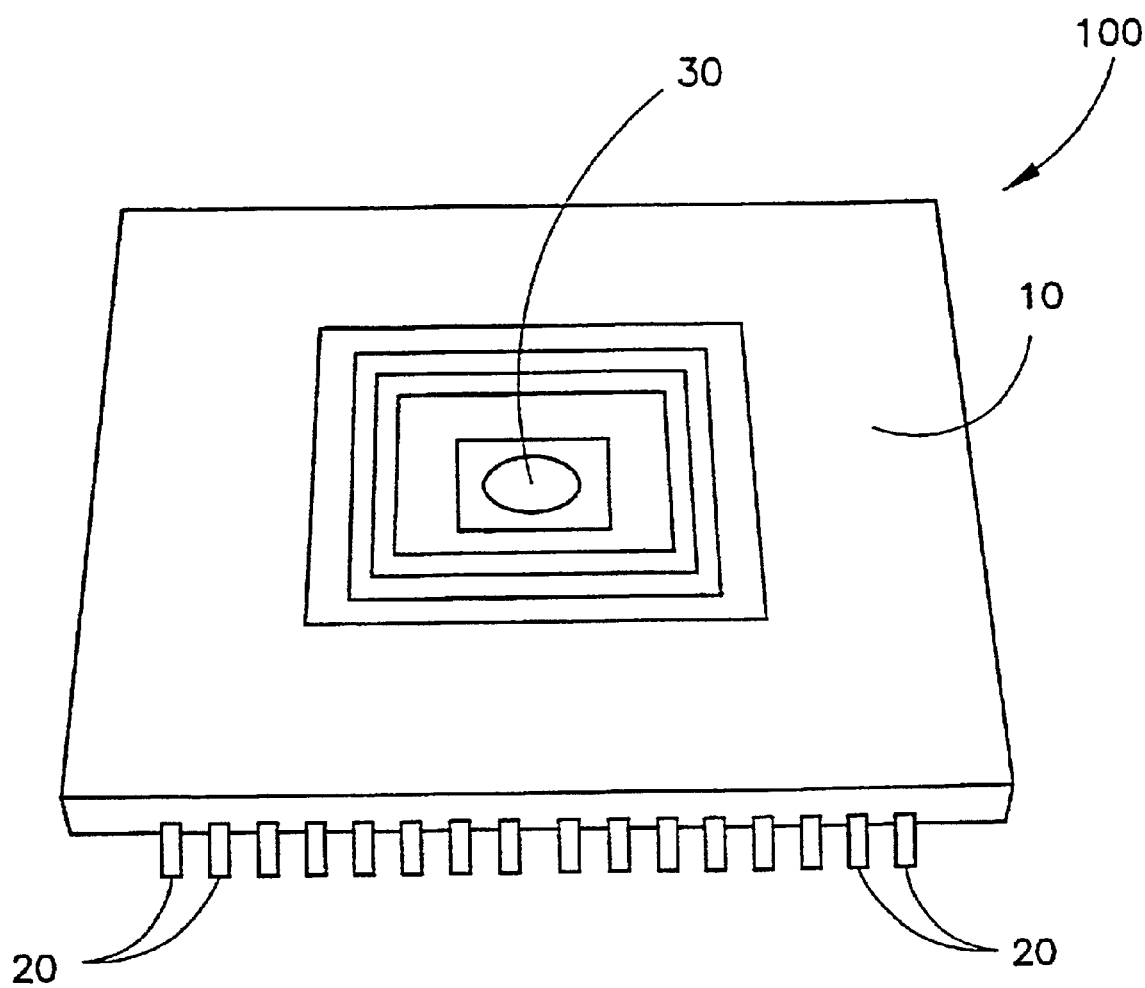
FIG. 1 is a perspective view of a first exemplary semiconductor device.

Referring now to the drawings, and more particularly to FIG. 1, a perspective view of a first exemplary semiconductor device 100 is shown. In particular, the semiconductor device 100 may provide functionality such as processing, memory and/or other functions. As will be described herein, the particular functions provided by the device 100 is not critical to the present invention. Accordingly, the principles of the present invention may be applied to semiconductor devices, such as the device 100, regardless of their functionality.

In FIG. 1, the semiconductor device 100 includes a package 10 that embodies the device 100 as a "chip." The package 10 may, for example, be comprised of an epoxy, ceramic or other material. As previously indicated herein, the process of assembling a semiconductor device into a package, such as package 10, is well known in the semiconductor industry.

A plurality of electrically conductive terminals 20 extend outwardly from one side of the package 10, and provide a means through which electrical signals are input to and output from the semiconductor device 100 during operation. For purposes of example, the electrically conductive terminals 20 are illustrated in FIG. 1 as a plurality of pins. However, it will be recognized by those skilled in the art that other types of electrically conductive terminals, such as solder balls, may be employed. Moreover, the number of electrically conductive terminals 20, and their spatial arrangement is typically dependent upon factors such as the intended use of the semiconductor device 100. As will be described herein, the principles of the present invention may be applied to semiconductor devices regardless of the number of electrically conductive terminals they include, or the spatial arrangement thereof.

A die 30 is encased within the package 10, and is comprised of electrical circuitry (e.g., transistors, diodes, resistors, capacitors, logic gates, etc.) that enables the functionality of the semiconductor device 100. Although not expressly shown in FIG. 1, the die 30 is electrically connected to the electrically conductive terminals 20 so that electrical signals may be transmitted between the die 30 and one or more external components (not shown) during operation of the semiconductor device 100. In FIG. 1, the die 30 is externally exposed through a cavity formed within one side of the package 10. In particular, the semiconductor device 100 of FIG. 1 may be described as having a "cavity up" configuration since the cavity and the electrically conductive terminals 20 are on opposite sides of the package 10. It is common practice in the semiconductor industry to create such a cavity by removing a portion of the package 10, and thereby exposing the die 30. In particular, the creation of such a cavity enables the die 30 to be operated upon during a process, such as an RIE process or other process where the semiconductor device 100 is exposed to an electrically charged environment.

Figure 2:
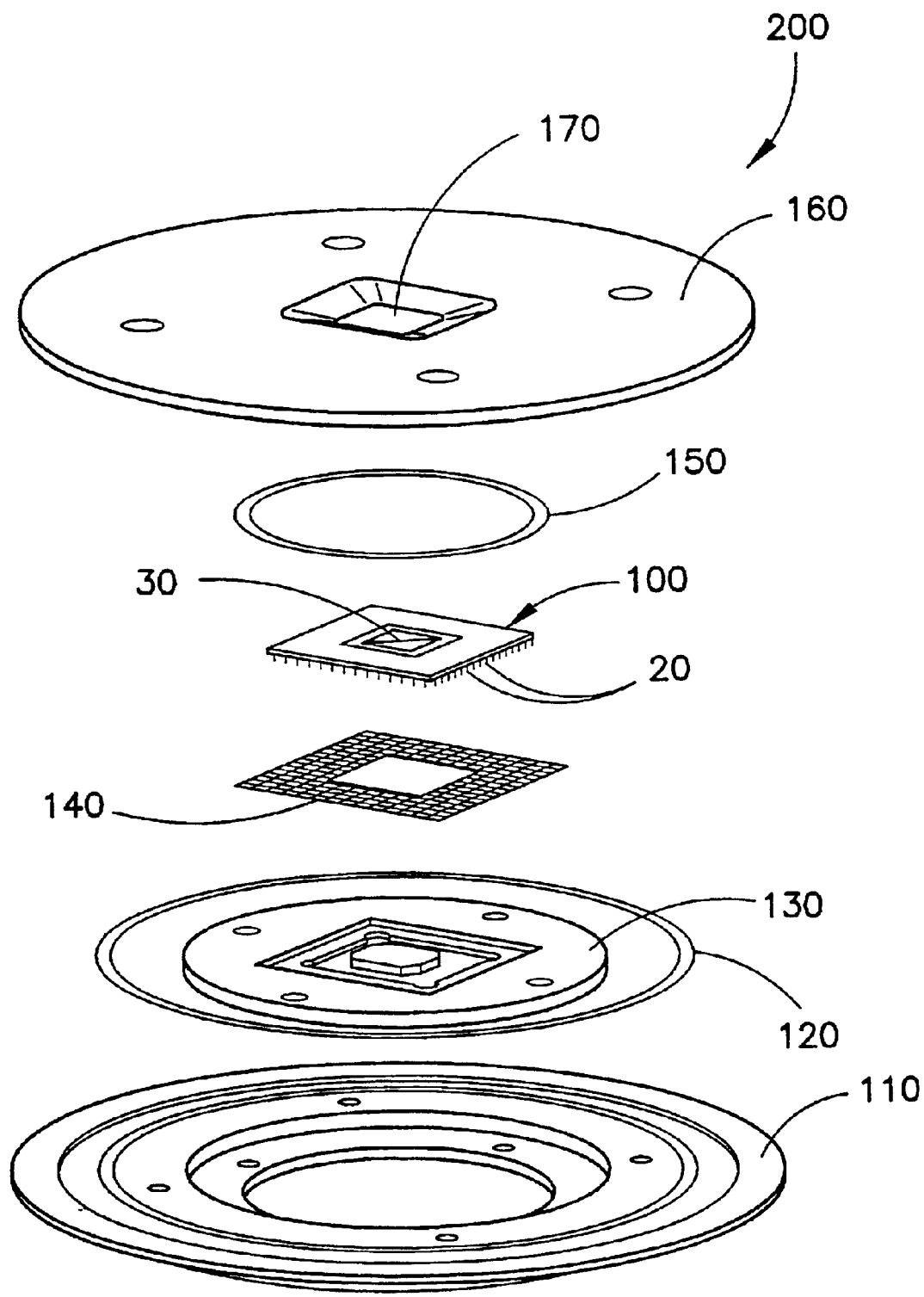
FIG. 2 is an exploded perspective view of a first exemplary shuttle device according to the present invention.

Referring to FIG. 2, an exploded perspective view of a first exemplary shuttle device 200 according to the present invention is shown. The shuttle device 200 of FIG. 2 may be a component of an apparatus such as an RIE apparatus that operates upon a semiconductor device by exposing it to an electrically charged environment. In particular, the shuttle device 200 is operative to secure a semiconductor device having a "cavity up" configuration, such as semiconductor device 100 of FIG. 1 within such an electrically charged environment. More specifically, the shuttle device 200 secures such a semiconductor device within an electrically charged environment so that its die is exposed to the electrically charged environment, while the remaining portion of the device is isolated from the electrically charged environment. Moreover, the shuttle device 200 is operative to electrically ground the electrically conductive terminals of the semiconductor device when the device is exposed to the electrically charged environment, thereby protecting the device from electrical overstress damage.

In FIG. 2, the exemplary shuttle device 200 comprises a base 110, a sealing ring 120, a platform 130, a grounding mechanism 140, a sealing ring 150, and a cover 160. According to an exemplary embodiment, the base 110 provides a foundation upon which the other elements of the shuttle device 200 are supported. The sealing ring 120 cooperates with the base 110 and the cover 160 to thereby provide an air tight seal within an inner portion of the shuttle device 200.

The platform 130 fits upon and is securable to the base 110 via one or more connecting members, such as one or more bolts or screws (not shown). The platform 130 accommodates placement of a semiconductor device having a "cavity up" configuration, such as the semiconductor device 100 of FIG. 1. That is, the platform 130 has a recess formed therein that conforms to the shape of a semiconductor device having a "cavity up" configuration. As indicated in FIG. 2, the semiconductor device 100 having such a "cavity up" configuration may be placed upon the platform 130 and secured within the shuttle device 200 during a process such as an RIE process where the semiconductor device 100 is exposed to an electrically charged environment.

The grounding mechanism 140 is positioned within the recess of the platform 130 and electrically connects each of the electrically conductive terminals 20 of the semiconductor device 100 to a ground potential. By doing so, the grounding mechanism 140 electrically grounds the semiconductor device 100 and thereby protects it from electrical overstress damage during processes, such as an RIE process, where the device 100 is exposed to an electrically charged environment.

According to an exemplary embodiment, the grounding mechanism 140 is electrically connected to the platform 130, and the platform 130 is electrically connected to a ground potential either directly, or through one or more other electrically conductive elements, such as base 110. In particular, the base 110 may act as a source of ground potential. According to another exemplary embodiment, the grounding mechanism 140 is directly connected to a ground potential through, for example, one or more wires.

The grounding mechanism 140 is preferably composed of a flexible, electrically conductive material such as copper, aluminum or other conductive material that is reusable. That is, the grounding mechanism 140 is preferably constructed such that it may be easily inserted into and removed from the recess within the platform 130. In this manner, the grounding mechanism 140 may be repeatedly used during processes, such as an RIE process, where the semiconductor device 100 is exposed to an electrically charged environment. As will be discussed later herein, the grounding mechanism 140 may be constructed using a number of different designs.

The sealing ring 150 cooperates with the platform 130 and the cover 160, and functions in conjunction with the sealing ring 120 to thereby provide an air tight seal within an inner portion of the shuttle device 200. The cover 160 fits upon and is securable to the base 110 via one or more connecting members, such as one or more bolts or screws (not shown). An opening 170 is formed within the cover 160 and enables the die 30 of the semiconductor device 100 to be exposed during a process, such as an RIE process.

Figure 3:
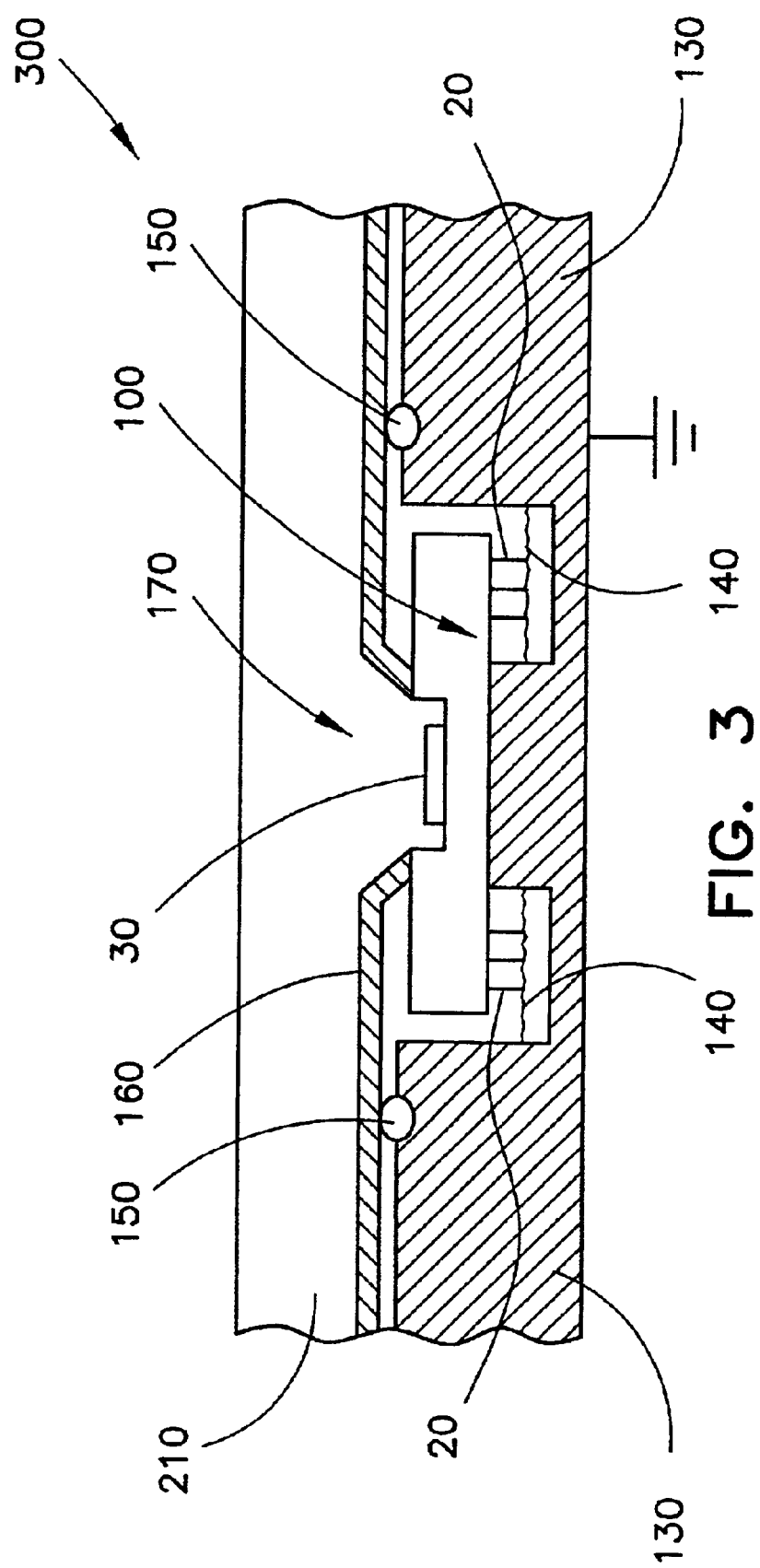
FIG. 3 is a fragmentary cutaway view of a relevant portion of an exemplary apparatus including the first exemplary shuttle device of FIG. 2.

Referring to FIG. 3, a fragmentary cutaway view of a relevant portion of an exemplary apparatus 300 including the first exemplary shuttle device 200 of FIG. 2 is shown. For purposes of example and explanation, the apparatus 300 of FIG. 3 is shown as a portion of an apparatus that performs an RIE process upon the semiconductor device 100 of FIG. 1 having a "cavity up" configuration.

In FIG. 3, the shuttle device 200 secures the semiconductor device 100 within a chamber 210 such that the die 30 is exposed to the chamber 210 and the electrically conductive terminals 20 are isolated from the chamber 210. During an RIE process, reactive ions are emitted from a source (not shown) and pass through the opening 170 of the shuttle cover 160 to selectively etch the die 30. The reactive ions emitted during the RIE process cause the chamber 210 to be electrically charged. This electrical charge tends to accumulate on the semiconductor device 100, and if not discharged, can cause electrical overstress damage to the device 100 thus destroying its functionality.

Accordingly, to prevent such damage from occurring, the grounding mechanism 140 electrically connects each of the electrically conductive terminals 20 to a ground potential and thereby discharges the semiconductor device 100. As previously indicated herein, the grounding mechanism 140 may be electrically connected to the ground potential through another element of the shuttle device 200, such as platform 130 (as shown in FIG. 3) and the base 110 (shown in FIG. 2). Alternatively or additionally, the grounding mechanism 140 may be directly connected to a ground potential through, for example, one or more wires (not shown in FIG. 3). Further exemplary details regarding the grounding mechanism 140 will be provided later herein.

Figure 4:
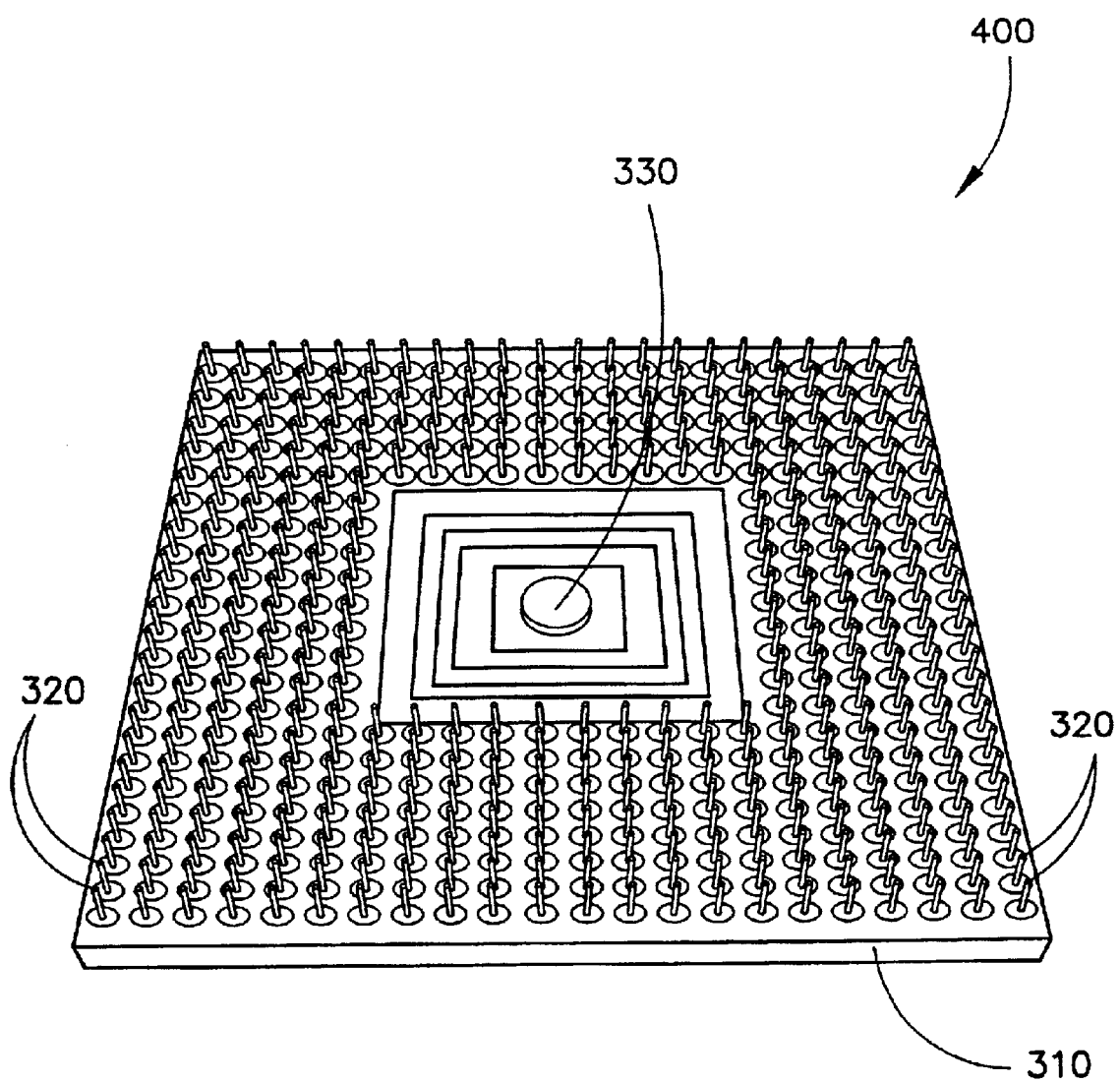
FIG. 4 is a perspective view of a second exemplary semiconductor device.

Referring now to FIG. 4, a perspective view of a second exemplary semiconductor device 400 is shown. Like the semiconductor device 100 of FIG. 1, the semiconductor device 400 of FIG. 4 may also provide functionality such as processing, memory and/or other functions, although such functions are not critical to the present invention. Moreover, the semiconductor device 400 of FIG. 4 includes elements that are the same as, or similar to the elements of the semiconductor device 100 of FIG. 1. In particular, the semiconductor device 400 includes a package 310, a plurality of electrically conductive terminals 320, and a die 330 which correspond respectively to the package 10, the electrically conductive terminals 20, and the die 30 of the semiconductor device 100 of FIG. 1. Accordingly, for clarity of description, these common elements will not be described again.

The semiconductor device 400 of FIG. 4, however, is different from the semiconductor device 100 of FIG. 1 in that the semiconductor device 400 has a "cavity down" configuration. That is, with the semiconductor device 400 of FIG. 4, its cavity exposing the die 330 and the electrically conductive terminals 320 are on the same side of the package 310. As will be described herein, the principles of the present invention also apply to such semiconductor devices having a "cavity down" configuration.

Figure 5:
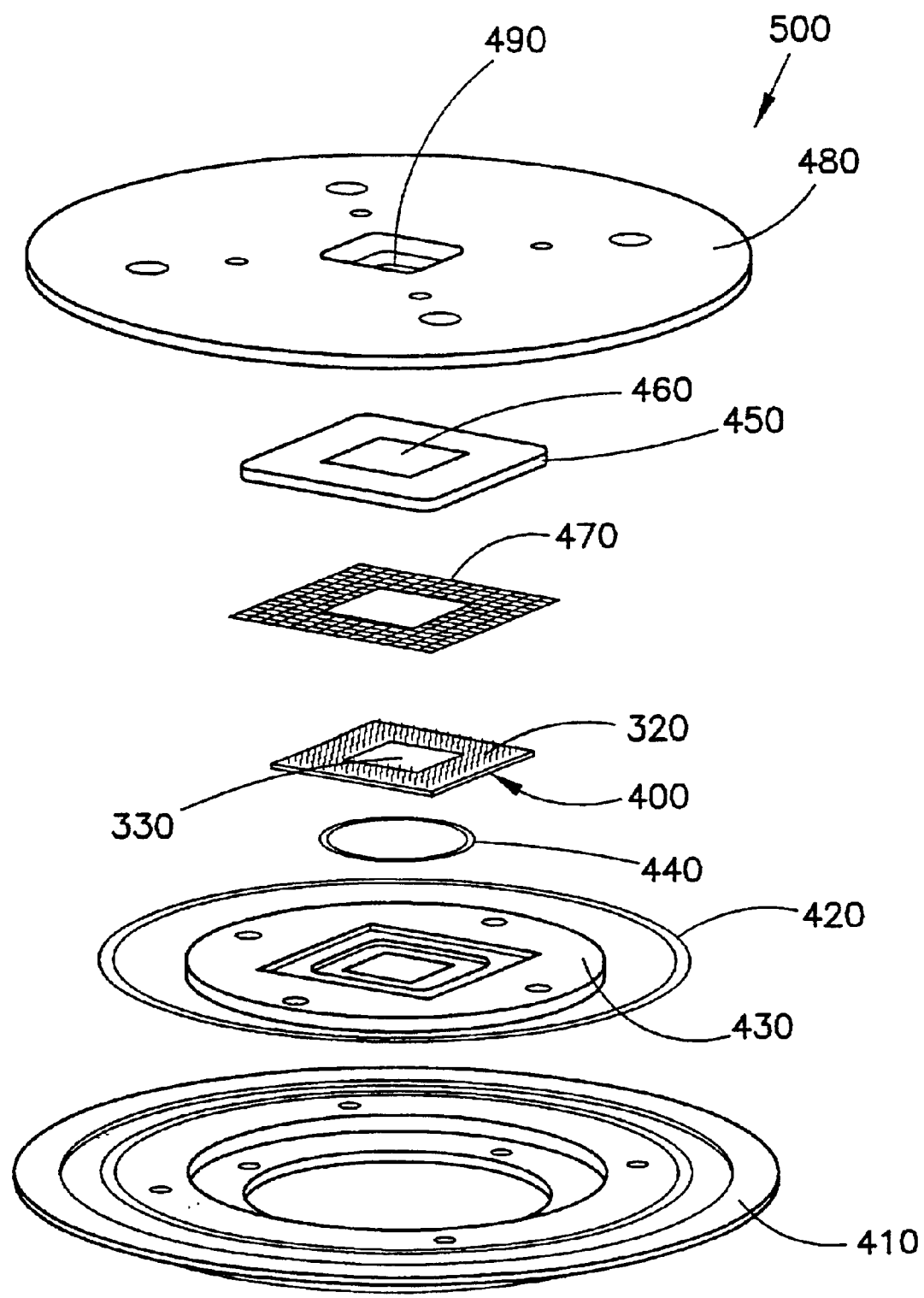
FIG. 5 is an exploded perspective view of a second exemplary shuttle according to the present invention.

Referring to FIG. 5, an exploded perspective view of a second exemplary shuttle device 500 according to the present invention is shown. Like the shuttle device 200 of FIG. 2, the shuttle device 500 of FIG. 5 may be a component of an apparatus such as an RIE apparatus that operates upon a semiconductor device by exposing it to an electrically charged environment. The shuttle device 500 also secures a semiconductor device within an electrically charged so that its die is exposed to the electrically charged environment, while the remaining portion of the device is isolated from the electrically charged environment. Moreover, the shuttle device 500 of FIG. 5 is operative to electrically ground the electrically conductive terminals of the semiconductor device when the device is exposed to the electrically charged environment, thereby protecting the device from electrical overstress damage.

The shuttle device 500 of FIG. 5, however, is different from the shuttle device 200 of FIG. 2 in that the shuttle device 500 accommodates a semiconductor device having a "cavity down" configuration, such as the semiconductor device 400 of FIG. 4. Because of this difference, the configuration of the shuttle device 500 of FIG. 5 is slightly different than the configuration of the shuttle device 200 of FIG. 2.

In FIG. 5, the shuttle device 500 comprises a base 410, a sealing ring 420, a platform 430, a sealing ring 440, a frame 450, a grounding mechanism 470, and a cover 480. According to an exemplary embodiment, the base 410 provides a foundation upon which the other elements of the shuttle device 500 are supported. The sealing ring 420 cooperates with the base 410 and the cover 470 to thereby provide an air tight seal within an inner portion of the shuttle device 500.

The platform 430 fits upon and is securable to the base 410 via one or more connecting members, such as one or more bolts or screws (not shown). The platform 430 accommodates placement of a semiconductor device having a "cavity down" configuration, such as the semiconductor device 400 of FIG. 4. That is, the platform 430 has a recess formed therein that conforms to the shape of a semiconductor device having a "cavity down" configuration. The sealing ring 440 is positioned within the recess of the platform 430. As indicated in FIG. 5, the semiconductor device 400 having such a "cavity down" configuration may be placed upon the sealing ring 440 and secured within the shuttle device 500 during a process such as an RIE process where the semiconductor device 400 is exposed to an electrically charged environment.

The frame 450 circumscribes the semiconductor device 400, and connects to the platform 430 via one or more connecting members, such as one or more bolts or screws (not shown), thus securing the semiconductor device 400 to the platform 430. An opening 460 is formed within the frame 450 and enables the die 330 of the semiconductor device 400 to be exposed during a process, such as an RIE process.

The grounding mechanism 470 is positioned within an inner portion of the frame 450 and electrically connects each of the electrically conductive terminals 320 of the semiconductor device 400 to a ground potential. By doing so, the grounding mechanism 470 electrically grounds the semiconductor device 400 and thereby protects it from electrical overstress damage during processes, such as an RIE process, where the device 400 is exposed to an electrically charged environment.

According to an exemplary embodiment, the grounding mechanism 470 is electrically connected to the platform 430 through the frame 450, and the platform 430 is electrically connected to a ground potential either directly, or through one or more other electrically conductive elements, such as base 410. According to another exemplary embodiment, the grounding mechanism 470 is directly connected to a ground potential through, for example, one or more wires.

Like the grounding mechanism 140 of FIG. 2, the grounding mechanism 470 is preferably composed of a flexible, electrically conductive material such as copper, aluminum or other conductive material that is reusable. Accordingly, the grounding mechanism 470 is preferably constructed such that it may be easily inserted into and removed from the inner portion of the frame 450. In this manner, the grounding mechanism 470 may be repeatedly used during processes, such as an RIE process, where the semiconductor device 400 is exposed to an electrically charged environment. As will be discussed later herein, the grounding mechanism 470 may be constructed using a number of different designs.

The cover 480 fits upon and is securable to the base 410 via one or more connecting members, such as one or more bolts or screws (not shown). An opening 490 is formed within the cover 480 and enables the die 330 of the semiconductor device 400 to be exposed during a process, such as an RIE process.

Figure 6:
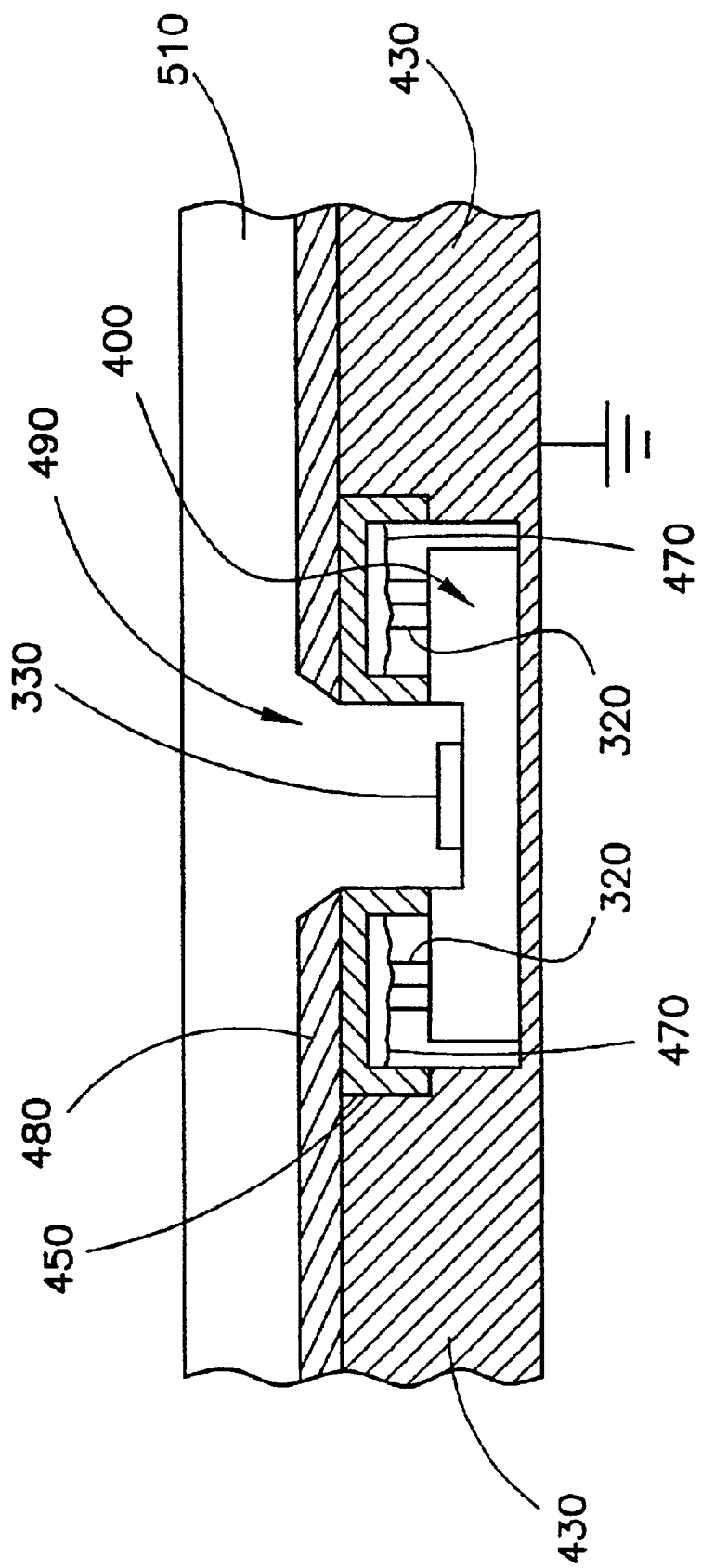
FIG. 6 is a fragmentary cutaway view of a relevant portion of an exemplary apparatus including the second exemplary shuttle device of FIG. 5.

Referring to FIG. 6, a fragmentary cutaway view of a relevant portion of an exemplary apparatus 600 including the second exemplary shuttle device of FIG. 5 is shown. For purposes of example and explanation, the apparatus 600 of FIG. 6 is shown as a portion of an apparatus that performs an RIE process upon the semiconductor device 400 of FIG. 4 having a "cavity down" configuration.

In FIG. 6, the shuttle device 500 secures the semiconductor device 400 within a chamber 510 such that the die 330 is exposed to the chamber 510 and the electrically conductive terminals 320 are isolated from the chamber 510. During an RIE process, reactive ions are emitted from a source (not shown) and pass through the opening 490 of the shuttle cover 480 to selectively etch the die 330. The reactive ions emitted during the RIE process cause the chamber 510 to be electrically charged. This electrical charge tends to accumulate on the semiconductor device 400, and if not discharged, can cause electrical overstress damage to the device 400 thus destroying its functionality.

Accordingly, to prevent such damage from occurring, the grounding mechanism 470 electrically connects each of the electrically conductive terminals 320 to a ground potential and thereby discharges the semiconductor device 400. As previously indicated herein, the grounding mechanism 470 may be electrically connected to the ground potential through another element of the shuttle device 500, such as platform 430 (as shown in FIG. 6). Alternatively or additionally, the grounding mechanism 470 may be directly connected to a ground potential through, for example, one or more wires (not shown in FIG. 6). Further exemplary details regarding the grounding mechanism 470 will now be provided.

Figure 7:
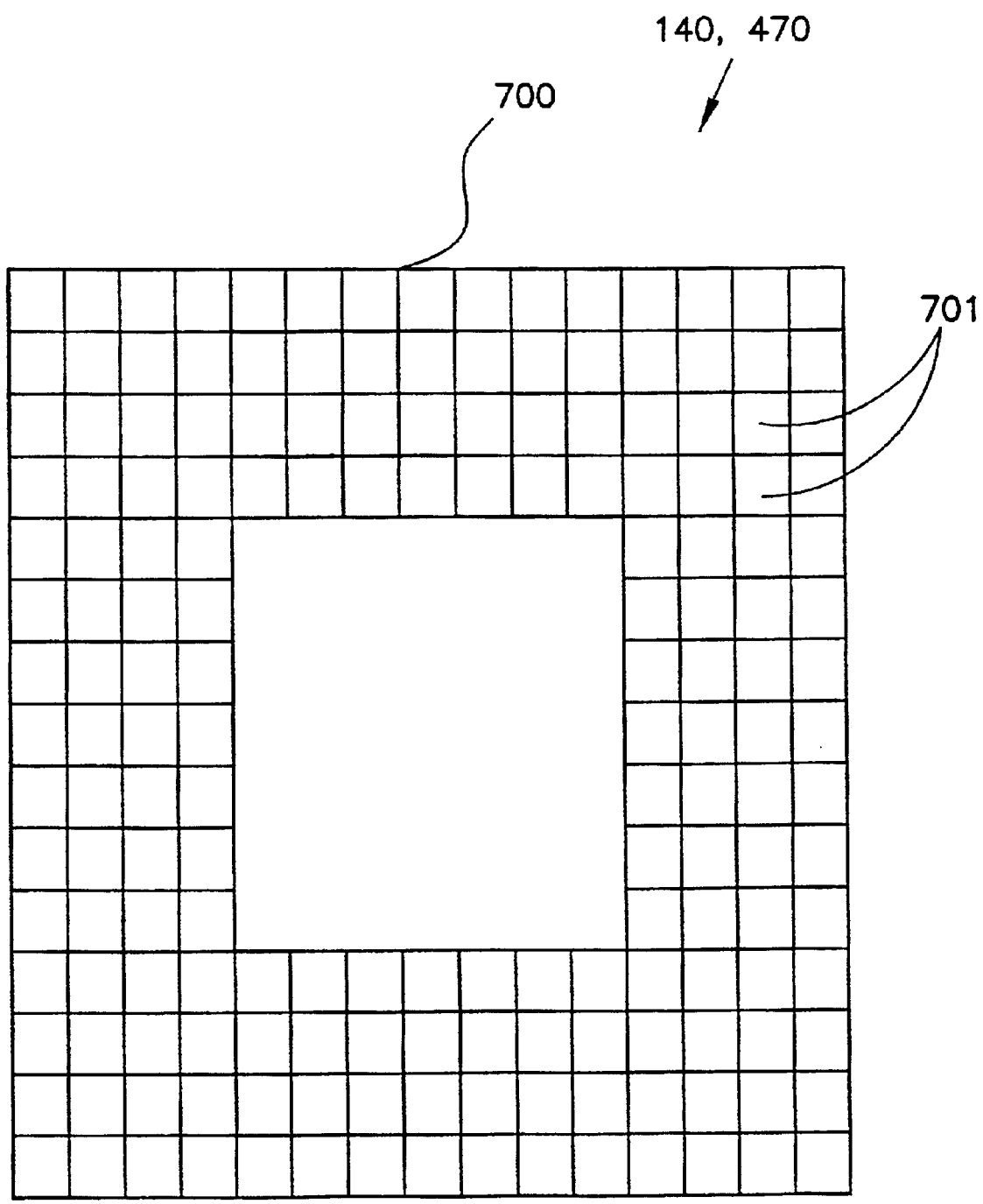
FIG. 7 is a plan view of a first exemplary grounding mechanism according to the present invention.
Figure 8:
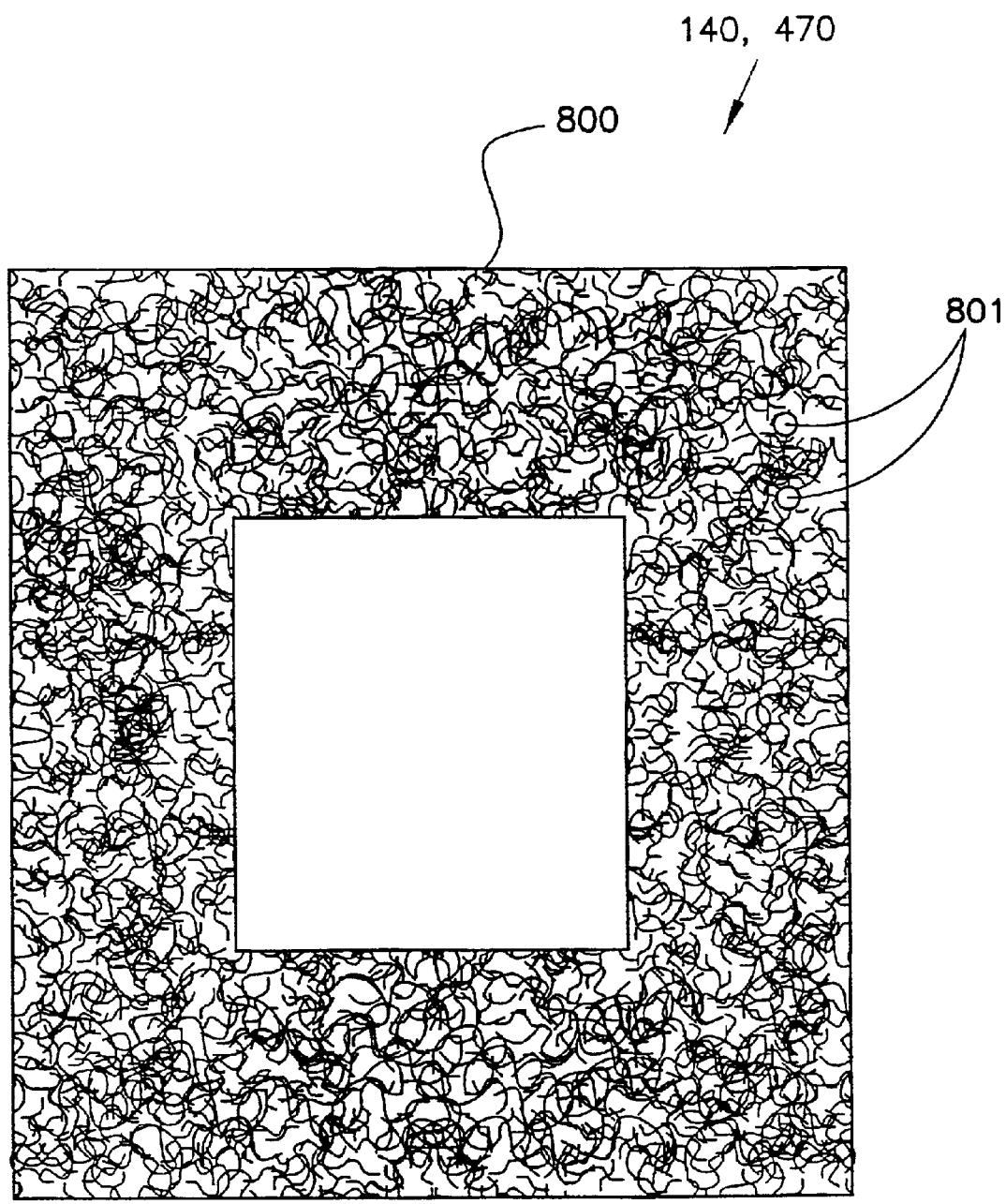
FIG. 8 is a plan view of a second exemplary grounding mechanism according to the present invention.
Figure 9:
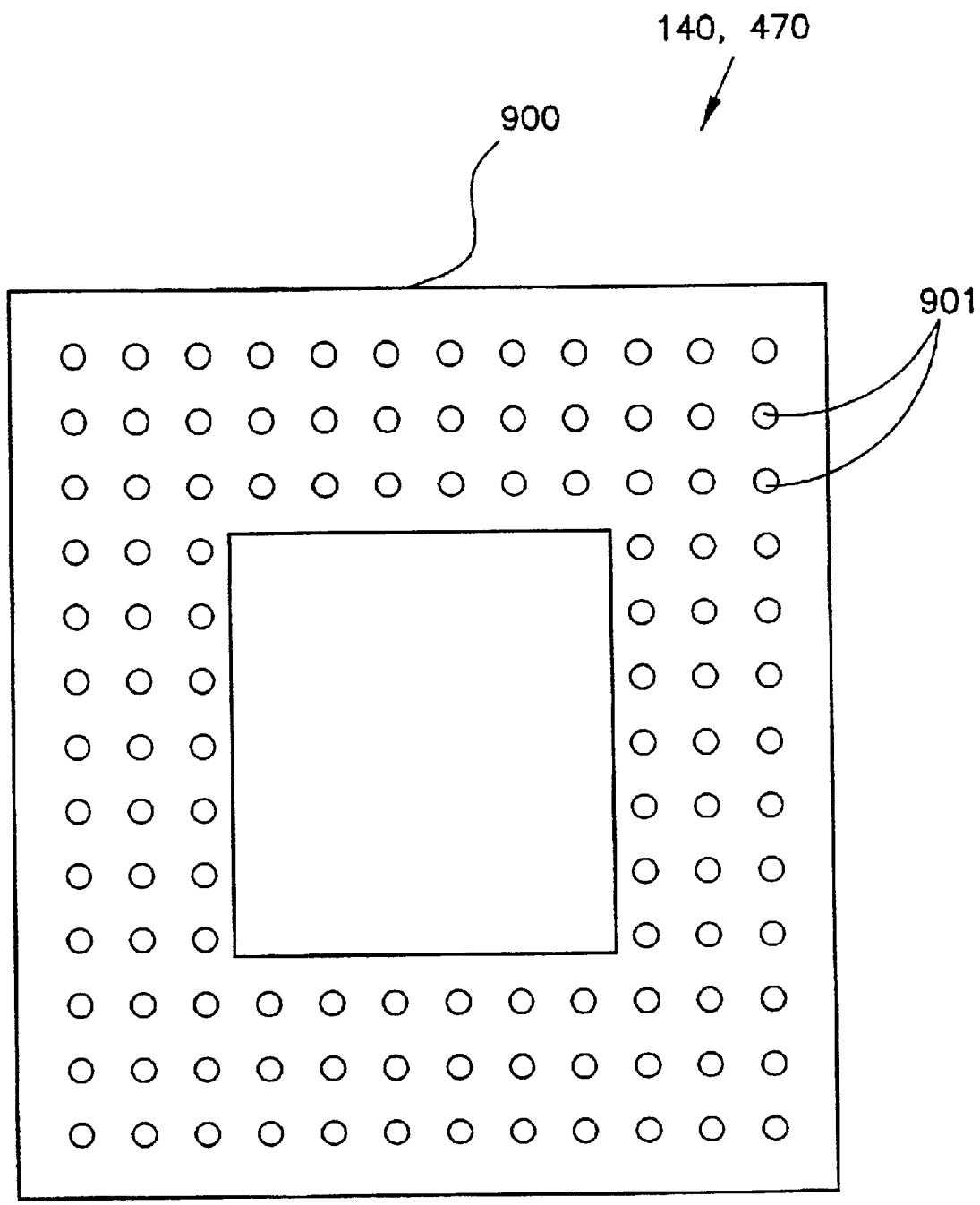
FIG. 9 is a plan view of a third exemplary grounding mechanism according to the present invention.

Referring to FIGS. 7 through 9, plan views of exemplary grounding mechanisms 140, 470 according to the present invention are shown. The mechanisms shown in FIGS. 7 through 9 are merely exemplary, and are not intended to limit the present invention in any manner. Accordingly, different designs than those shown in FIGS. 7 through 9 may be employed in accordance with the present invention.

In FIG. 7, a first exemplary grounding mechanism 140, 470 according to the present invention is shown. As indicated in FIG. 7, the first exemplary grounding mechanism 140, 470 comprises an electrically conductive mesh 700 having a plurality of polygonal apertures 701 formed therein. Each of the apertures 701 may for example be rectangular, trapezoidal or another polygonal shape. For purposes of example, the apertures 701 are shown as having a rectangular shape in FIG. 7. The apertures 701 are preferably sized such that they circumscribe each of the electrically conductive terminals 20, 320 of the semiconductor device 100, 400 and thereby enable an electrical connection between each of the electrically conductive terminals 20, 320 and the mesh 700. Accordingly, when the mesh 700 is electrically connected to a ground potential, each of the electrically conductive terminals 20, 320 are also electrically connected to the ground potential. The mesh 700 preferably has an outer perimeter at least as large as an outer perimeter of a packaged semiconductor device, and an inner perimeter defined by the size of an exposed die of the device.

In FIG. 8, a second exemplary grounding mechanism 140, 470 according to the present invention is shown. As indicated in FIG. 8, the second exemplary grounding mechanism 140, 470 comprises an electrically conductive mesh 800 having a plurality of random-shaped apertures 801 formed therein. The mesh 800 may for example be constructed as, or in a manner similar to steel wool. Accordingly, each of the apertures 801 may exhibit a different shape. However, regardless of their individual shapes, the apertures 801 are preferably sized such that they circumscribe each of the electrically conductive terminals 20, 320 of the semiconductor device 100, 400 and thereby enable an electrical connection between each of the electrically conductive terminals 20, 320 and the mesh 800. Therefore, when the mesh 800 is electrically connected to a ground potential, each of the electrically conductive terminals 20, 320 are also electrically connected to the ground potential. The mesh 800 preferably has an outer perimeter at least as large as an outer perimeter of a packaged semiconductor device, and an inner perimeter defined by the size of an exposed die of the device.

In FIG. 9, a third exemplary grounding mechanism 140, 470 according to the present invention is shown. As indicated in FIG. 9, the third exemplary grounding mechanism 140, 470 comprises an electrically conductive sheet 900 having a plurality of apertures 901 formed therein. Each of the apertures 901 may for example be circular, elliptical or another shape. The apertures 901 may also be embodied as slits formed within the sheet 900 that open when placed upon an individual electrically conductive terminal 20, 320, and close when removed therefrom. For purposes of example, the apertures 901 are shown in FIG. 9 as having a circular shape. Regardless of their shape, the apertures 901 are preferably sized such that they circumscribe each of the electrically conductive terminals 20, 320 of the semiconductor device 100, 400 and thereby enable an electrical connection between each of the electrically conductive terminals 20, 320 and the sheet 900. Accordingly, when the sheet 900 is electrically connected to a ground potential, each of the electrically conductive terminals 20, 320 are also electrically connected to the ground potential. The mesh 900 preferably has an outer perimeter at least as large as an outer perimeter of a packaged semiconductor device, and an inner perimeter defined by the size of an exposed die of the device.

As described herein, the present invention provides a grounding mechanism for a semiconductor device that advantageously protects the device from electrical overstress damage by electrically grounding the device during processes where an electrical charge can build up on the device.

While this invention has been described as having a preferred design, the present invention can be further modified within the spirit and scope of this disclosure. This application is therefore intended to cover any variations, uses, or adaptations of the invention using its general principles. For example, while the present invention has been described herein with reference to an RIE process, it may also be applicable to other processes and/or devices (e.g., focus ion beam processes, inductively coupled plasma processes, scanning electron microscopes, etc.) where an electrical charge may accumulate on a semiconductor device. Further, this application is intended to cover such departures from the present disclosure as come within known or customary practice in the art to which this invention pertains and which fall within the limits of the appended claims.

What is claimed is:

1. An apparatus for exposing a semiconductor device to an electrically charged environment, comprising:
   a configuration operative to secure the semiconductor device such that a first portion of the semiconductor device is exposed to the electrically charged environment and a second portion of the semiconductor device is isolated from the electrically charged environment; and wherein the configuration includes a grounding mechanism operative to electrically connect the second portion of the semiconductor device to a ground potential while the first portion of the semiconductor device is exposed to the electrically charged environment.

2. The apparatus of claim 1, wherein the grounding mechanism is electrically connected directly to the ground potential.

3. The apparatus of claim 1, wherein the grounding mechanism is electrically connected to the ground potential through at least one other component of the configuration.

4. The apparatus of claim 1, wherein the first portion of the semiconductor device comprises a die.

5. The apparatus of claim 1, wherein the second portion of the semiconductor device comprises a plurality of electrically conductive terminals.

6. The apparatus of claim 5, wherein the plurality of electrically conductive terminals comprises a plurality of pins.

7. The apparatus of claim 5, wherein the plurality of electrically conductive terminals comprises a plurality of solder balls.

8. The apparatus of claim 1, wherein the electrically charged environment comprises a reactive ion etching chamber.

9. The apparatus of claim 1, wherein the grounding mechanism comprises an electrically conductive mesh having a plurality of polygonal apertures formed therein.

10. The apparatus of claim 1, wherein the grounding mechanism comprises an electrically conductive mesh having a plurality of random-shaped apertures formed therein.

11. The apparatus of claim 1, wherein the grounding mechanism comprises an electrically conductive sheet having a plurality of apertures formed therein.

12. A configuration for securing a semiconductor device within an electrically charged environment, comprising:

means for securing the semiconductor device such that a die of the semiconductor device is exposed to the electrically charged environment and electrically conductive terminals of the semiconductor device are isolated from the electrically charged environment; and means for electrically connecting each of the electrically conductive terminals to a ground potential while the die is exposed to the electrically charged environment.

13. The configuration of claim 12, wherein the electrically connecting means is electrically connected directly to the ground potential.

14. The configuration of claim 12, wherein the electrically connecting means is electrically connected to the ground potential through the securing means.

15. The configuration of claim 12, wherein the electrically charged environment comprises a reactive ion etching chamber.

16. The configuration of claim 12, wherein the electrically connecting means comprises an electrically conductive mesh having a plurality of polygonal apertures formed therein.

17. The configuration of claim 12, wherein the electrically connecting means comprises an electrically conductive mesh having a plurality of random-shaped apertures formed therein.

18. The configuration of claim 12, wherein the electrically connecting means comprises an electrically conductive sheet having a plurality of apertures formed therein.

19. A method for protecting a semiconductor device, comprising steps of:

securing the semiconductor device within an electrically charged environment such that a die of the semiconductor device is exposed to the electrically charged environment and electrically conductive terminals of the semiconductor device are isolated from the electrically charged environment; and electrically connecting the electrically conductive terminals to a ground potential while the die is exposed to the electrically charged environment.

20. The method of claim 19, wherein the electrically conductive terminals are electrically connected to the ground potential through one of (i) an electrically conductive mesh having a plurality of apertures formed therein, and (ii) an electrically conductive sheet having a plurality of apertures formed therein.

* * * * *